United States Patent [19]

Roschmann et al.

[11] Patent Number: 4,712,067
[45] Date of Patent: Dec. 8, 1987

[54] R.F. COIL SYSTEM FOR GENERATING AND/OR RECEIVING ALTERNATING MAGNETIC FIELDS

[75] Inventors: Peter Roschmann, Hamburg, Fed. Rep. of Germany; Howard E. Simon, Monroe, Conn.

[73] Assignee: U.S. Philips Corporation, New York, N.Y.

[21] Appl. No.: 684,199

[22] Filed: Dec. 20, 1984

[30] Foreign Application Priority Data

Dec. 30, 1983 [DE] Fed. Rep. of Germany ....... 3347597

[51] Int. Cl.⁴ ............................................. G01R 33/20
[52] U.S. Cl. ..................................... 324/318; 324/322; 335/299; 333/219
[58] Field of Search ............... 324/318, 322, 307, 319, 324/320, 313; 333/219, 227, 33; 335/299, 301; 343/741, 742

[56] References Cited

U.S. PATENT DOCUMENTS

| | | | |
|---|---|---|---|
| 4,320,342 | 3/1982 | Heinzerling | 324/319 |
| 4,362,993 | 12/1982 | Young et al. | 324/309 |
| 4,439,733 | 3/1984 | Hinshaw et al. | 324/322 |
| 4,506,224 | 3/1985 | Krause | 324/319 |
| 4,594,566 | 6/1986 | Maudsley | 324/318 X |
| 4,642,569 | 2/1987 | Hayes et al. | 324/318 |

FOREIGN PATENT DOCUMENTS 0047065  3/1982  European Pat. Off. ............ 324/318
2404100  9/1974  Fed. Rep. of Germany ...... 324/318

Primary Examiner—Jerry W. Myracle
Assistant Examiner—Scott M. Oldham
Attorney, Agent, or Firm—Robert T. Mayer; Algy Tamoshunas

[57] ABSTRACT

An R.F. coil system is described for generating and/or receiving at least substantially homogeneous alternating magnetic fields, notably in nuclear magnetic resonance apparatus. The system is arranged about an essentially cylindrical examination space and comprises at least four conductor segments which are oriented essentially parallel to the longitudinal central axis of the examination space. The conductor segments are arranged about the circumference of the examination space symmetrically with respect to at least one plane which extends through the longitudinal central axis and are interconnectd so as to form a closed loop. The conductor segments which receive a current of the same sense with respect to the longitudinal axis, are interconnected at neighboring ends by conductor elements which are oriented essentially in the circumferential direction of the examination space so as to form conductor groups. The conductor groups are, in turn, interconnected by connection leads which are connected to the conductor elements. The length (LO) of the connection leads are chosen so that an amplitude maximum of the R.F. currents is formed at the center of each conductor segment while at least one amplitude minimum of the R.F. currents is present on each connection lead.

40 Claims, 21 Drawing Figures

R.F. COIL SYSTEM FOR GENERATING AND/OR RECEIVING ALTERNATING MAGNETIC FIELDS

BACKGROUND OF THE INVENTION

The invention relates to an R.F. coil system for generating and/or receiving at least substantially homogeneous alternating magnetic fields, notably in nuclear magnetic resonance apparatus. Such a system is arranged about an essentially cylindrical examination space and comprises at least four conductor segments which extend essentially parallel to the longitudinal central axis of the examination space and which are symmetrically oriented at the circumference thereof with respect to at least one plane which extends through the longitudinal central axis, said conductor segments being interconnected by means of connection leads in order to form a closed loop.

European Patent Application No. 83 201 449.2, notably FIG. 2 and the accompanying description, proposes a transmitter/measurement coil which is arranged about an examination space for an object to be examined in a nuclear magnetic resonance tomography apparatus. The proposed transmitter/measurement coil is constructed as a saddle-shaped coil which consists of two coil halves. For the excitation of the coil, the parallel connected coil halves are fed by an R.F. current source. Each of the coil halves consists of two conductor segments which extend in the axial direction of the transmitter/measurement coil as well as of two sections which extend in the circumferential direction of the transmitter/measurement coil. All four elements are connected in series in order to form a ring and are, via supply leads, connected to the R.F. current source at end points of this series connection which form coil connection terminals.

The coil connection terminals are also bridged by a tuning capacitor. The coil and the tuning capacitor together form a parallel resonant circuit which is tuned to resonance at the frequency of the R.F. source. The aim is to improve the R.F. magnetic field efficiency of the transmitter/measurement coil.

As the frequency of the R.F. source increases, the value of the tuning capacitor must be reduced for resonance tuning in accordance with the known formula for resonant circuits. The frequency at which the transmitter/measurement coil itself resonates, without additional tuning capacitor, is referred to as the natural frequency of the coil. The developed length of the conductors of saddle-shaped coils is generally from 15 to 20% of the wavelength of the oscillation at the natural frequency of the coil. The exact value depends on the coil geometry and on stray capacitances of the coil with respect to surrounding conductors. R.F. currents flowing through the coil during operation in the range of the natural frequency exhibit substantial phase shifts along the developed length of the coil conductors. Consequently, the R.F. magnetic field produced by the coil, notably by its axially oriented conductor segments, becomes noticeably inhomogeneous when the operating frequency of the saddle-shaped coil is in the range of the natural frequency. The saddle-shaped coil produces an at least substantially homogeneous R.F. magnetic field only if the frequency of the R.F. source is substantially lower than the natural frequency of the saddle-shaped coil.

Homogeneous R.F. magnetic fields are required, for example, for nuclear magnetic resonance tomography. Therein, the body to be examined, such as a living organism, is introduced into a static, homogeneous primary magnetic field. Because of their nuclear spin, the atomic nuclei have a magnetic moment which is aligned in the primary magnetic field. The degree of alignment increases as the magnetic induction of the primary magnetic field increases.

When a magnetic alternating field acts on the atomic nuclei of the body to be examined in the direction perpendicular to the field lines of the primary magnetic field, the magnetic moments thereof perform a precessional motion which builds up and tips the magnetic moments in the opposite direction with respect to the primary magnetic field. From a quantum mechanical point of view, the magnetic moments are raised to higher energy states by application of energy from the alternating magnetic field; this requires a given amount of energy within a given frequency of the exciting alternating magnetic field. This frequency is referred to as the nuclear magnetic resonance frequency f0 and is linked to the magnetic induction B0 of the primary magnetic field in accordance with the following equation ($\times$ represents the multiplication sign):

$$f0 = g \times B0.$$

In the equation, g is the gyromagnetic ratio which depends on the atomic species and which amounts to, for example, 42.58 MHz/T for hydrogen, 17.23 MHz/T for phosphorus, and 11.26 MHz/T for sodium. By a corresponding choice of the frequencies of the alternating magnetic field, the individual atomic species can thus be selectively excited, thus enabling selective measurement of the relaxation signals from the atoms during the decay from their excited state after the alternating magnetic field is switched off.

It has been found that the image quality in nuclear magnetic resonance tomography increases as the magnetic induction of the primary magnetic field increases, because the number of aligned magnetic moments of the atomic nuclei is thus increased proportionally. However, the nuclear magnetic resonance frequencies for the various atomic species are thus also increased. The R.F. coil system (transmitter/receiving coil) which generates the R.F. alternating magnetic field in the examination space and which receives the relaxation signals from the atomic nuclei, must then produce a magnetic field whose homogeneity satisfies the requirements imposed by nuclear magnetic resonance tomography, even in the case of such higher frequencies.

It has been found that sufficiently homogeneous R.F. alternating fields can be generated by means of saddle-shaped coils only if the developed length of the conductors of the saddle-shaped coils amounts to no more than approximately 1/12 of the wavelength at the frequency of the coil currents, that is to say at the nuclear magnetic resonance frequency to be measured. However, because the developed lengths of such a saddle-shaped coil are determined by the dimensions of the body to be examined, saddle-shaped coils are only suitable for generating homogeneous alternating magnetic fields up to a given frequency. For example, in the case of saddle-shaped coils which are proportioned for measurements on the human head and whose axial length and diameter are approximately equal, the developed length amounts to approximately four times the coil diameter. When the latter is fixed at approximately 30 cm, the upper limit for the nuclear magnetic resonance frequency which can still be measured is approximately 20 MHz. For the measurement of the nuclear magnetic resonance of the hydrogen atom, the magnetic induction of the primary magnetic field may then amount to no more than approximately 0.5 T. For a satisfactory image quality in nuclear magnetic resonance tomography and notably also for a good resolution in nuclear magnetic resonance spectroscopy on a living organism, however, magnetic induction values of up to approximately 2 to 2.5 T are desired for the primary magnetic field.

The drawbacks of the known R.F coil system have been described above with reference to nuclear magnetic resonance tomography, but they occur in any arrangement in which at least substantially homogeneous R.F. alternating magnetic fields are to be generated in spaces whose dimensions are no longer small with respect to the wavelength of the R.F. field generated.

SUMMARY OF THE INVENTION

It is the object of the invention to provide an R.F. coil system of the kind described which allows for the generation and reception of at least substantially homogeneous R.F. alternating magnetic fields across spaces whose dimensions reach approximately the order of magnitude of the wavelength of the R.F. magnetic field and thus amount to a substantial fraction of the wavelength.

In an R.F. coil system of the kind described this object is achieved in accordance with the invention in that the conductor segments to which the current is to be applied in the same sense with respect to the longitudinal central axis of the examination space are interconnected at neighbouring ends by conductors which are oriented essentially in the circumferential direction of the examination space in order to form conductor groups. The conductor groups are interconnected by connection leads which are connected to the conductors oriented in the circumferential direction. The lengths of the connection leads are chosen so that an amplitude maximum of the R.F. currents is present in the center of each conductor segment and at least one amplitude minimum of the R.F. currents is present on each connection lead.

Contrary to the coil system proposed in the European Patent Application No. 83 201 449.2, in which all conductor sections of the saddle-shaped coil must have as small as possible dimensions with respect to the wavelength in order to avoid phase shifts of the R.F. currents in the conductors across the entire length of the coil, this phase shift is deliberately used in the R.F. coil system in accordance with the invention in order to produce currents having a given phase, that is to say a given direction with respect to the longitudinal central axis of the coil system, in the individual conductor segments. Use is made of the fact that the currents in a conductor correspond at two points which are separated by a distance amounting to an integer multiple of one half wavelength when an even multiple is concerned, and that their values correspond with an opposite sign when an odd multiple is concerned. Consequently, it is not necessary to generate all currents constituting to the R.F. alternating magnetic field with the same phase. It suffices when the phase shifts between these currents amount to an integer multiple of 180°, corresponding to an integer multiple of one half wavelength. In this way coil systems can be obtained whose dimensions reach at least approximately the order of the magnitude of the wavelength of the radiated R.F. alternating magnetic fields. The currents in the connection leads do not contribute to the building up of the R.F. alternating magnetic field, so that the phase shifts of the currents along the connection leads do not influence the shape of the alternating magnetic fields. The conductor segments which are fed by the connection leads are proportioned so that the currents flowing therein are subject to only minor phase shifts across the length of the conductor segments at the operating frequency of the coil system, so that the homogeneity of the alternating magnetic field to be generated is not noticeably influenced thereby.

When the lengths of the connection leads and the conductor segments are chosen in accordance with the invention, resonance of the coil system is obtained at the operating frequency, so that the current intensity in the conductor segments, and hence the magnetic field strength of the radiated alternating magnetic field, is high.

When used in nuclear magnetic resonance tomography, this means that the coil system in accordance with the invention is capable of enclosing an examination space whose dimensions reach the order of magnitude of the wavelength at the operating frequency. Conversely, a coil system having the dimensions imposed by the dimensions of the body to be examined can be used at higher frequencies. Thus, the magnetic conduction BO of the primary magnetic field can be increased from the values below 1 T which are customarily used thus far to values of from 2 to 2.5 T. This in turn leads to an improvement of the image quality in the case of nuclear magnetic resonance tomography or of the resolution in the case of nuclear magnetic resonance spectroscopy.

Moreover, the coil system in accordance with the invention is characterized by a simple construction and unimportant requirements as regards manufacturing tolerances.

In attractive elaborations of the invention, the ratio of the characteristic impedances Z0, Z1 of a conductor group and a connection lead and their lengths L0, L1 and propagation constants $\beta 0$, $\beta 1$ is in accordance with one of the relations:

$$Z0/Z1 = |\tan(\beta 0 \times L0/2) \times \tan(\beta 1 \times L1/2)|$$

or $$Z0/Z1 = |\tan(\beta 1 \times L1/2) \tan(\beta 0 \times L0/2)|$$

or is slightly higher. The first relation is applicable to a choice of the length of a connection lead where an odd number of amplitude minima is formed thereon. The second relation concerns the case where an even number of amplitude minima is formed. The relations take into account only the length L0 of a connection lead and the length L1 of a conductor group, that is to say a conductor segment. For a more accurate calculation it would also be necessary to take into account the effect of the conductors oriented in the circumferential direction, for example, by increasing the value used for L1 by a small amount, for example, 10%. For a given ratio Z0/Z1 a slightly lower value for $\beta 0$ and $\beta 1$ is then obtained, that is to say a slightly lower value for the resonance frequency.

In an elaboration of the invention, the connection leads comprise electrically conductive shields. As a result, only the conductor segments radiate an R.F. electromagnetic alternating field, so that the spatial shape thereof depends only on the value, directions and phase position of the R.F. currents in these conductors segments. The currents in the connection leads do not influence the alternating magnetic field to be generated and, conversely, they do not take up energy from an alternating field which is received. The spatial arrangement of the connection leads in the coil system can thus be simplified. The connection leads are preferably constructed as coaxial leads. The connections leads are then particularly simple with constant characteristic impedances so that suitable transmission properties and possibility of exact proportioning are ensured.

In a further elaboration of the invention, each conductor group comprises two neighbouring conductor segments. Thus, conductor groups of a simple construction are obtained whose conductors which are oriented in the circumferential direction of the examination space have a minimum length.

In a further elaboration of the invention, the conductor segments are arranged in two conductor groups which are symmetrically oriented with respect to a plane which extends through the longitudinal central axis. Using such an arrangement, preferably alternating fields are obtained whose magnetic field lines extend perpendicularly to the longitudinal central axis in said plane in the examination space and which are highly homogeneous in said plane as well as on either side thereof.

In a further elaboration of the invention, every two conductor segments whereto the current is to be applied in the same sense are arranged so as to enclose a circumferential angle of at least approximately 60° with respect to the examination space. In the examination space a particularly homogeneous pattern of the magnetic field lines of the R.F. alternating magnetic field is thus obtained even for a minimum number of conductor segments. This is particularly applicable to the case involving only two conductor groups comprising two conductor segments each.

In a further elaboration of the invention, the conductor segments are surrounded by an electrically conductive and magnetically permeable shield which is arranged so as to be electrically insulated from said segments.

When an R.F. magnetic alternating field is radiated into a body to be measured, the electrical and dielectric properties thereof have a decisive effect on the shape and the intensity of the fields. They determine the penetratability of the R.F. alternating magnetic fields into the body to be examined as well as the resonance frequency and the quality factor of the coil system. Moreover, notably the R.F. electrical fields may have disturbing effects on the body to be measured.

For example, during nuclear magnetic resonance tomography on living organic tissue it has been found that the introduction of the body to be measured into the coil system changes the quality factor and a shift of the resonance frequency of the coil system. In the case of a completely stationary body, the signal-to-noise ratio is thus reduced. In the case of movements of the body to be measured, including motions inside the body to be measured, an addtional amplitude or phase noise occurs in the received alternating magnetic field, depending on the variation of the quality factor and the resonance frequency shift of the coil system thus caused. It has been found that the shielding of R.F. alternating fields from the body to be measured can mitigate the adverse effect of the dielectric properties of the body on the signal-to-noise ratio.

In the coil system in accordance with the invention, at the area of the conductor segments amplitude maxima of the R.F. currents ("current antinodes") are formed and minima of the associated electrical voltage ("voltage nodes") are formed on the lead. Consequently, the R.F. electrical alternating field applied to the conductor segments by the coil system in accordance with the invention is small from the beginning. In order to reduce the effect of the remaining field on the body to be measured, the conductor segments are surrounded by the described shield. This shield keeps the remaining R.F. electrical alternating field away from the body to be measured, so that the dielectric losses in the body and their adverse effect on the image quality are avoided. The shield at the same time eliminates the risk of exposure of the body to be measured to electrical voltages. This is particularly important when the coil system in accordance with the invention is used in medical applications.

In a further elaboration of the invention, a closed section of the electrically conductive and magnetically permeable shield each time surrounds the conductor segments of one conductor group in common. Consequently, the conductor segments of a conductor group are effectively shielded from their surroundings; notably mutual influencing between these segments and connection leads and other conductor groups is precluded.

In a further elaboration of the invention, the electrically conductive and magnetically permeable shield comprises an inner shield which faces and encloses the examination space and an outer shield which is remote therefrom. The inner shield and the outer shield are comprised of sections which are shaped essentially as cylindrical surface segments. The outer shield prevents the radiation of R.F. alternating fields in the vicinity of the coil system, while the inner shield keeps R.F electrical alternating fields away from the examination space and the body to be measured which is present therein, but is permeable to R.F. magnetic alternating fields so as not to influence the application thereof to the body to be measured.

The permeability of the inner screen to R.F. magnetic alternating fields and the simultaneous shielding against electrical alternating fields are achieved in a further elaboration of the invention in that at the area of the conductor segments, the inner shield comprises slits which extend in the circumferential direction of the examination space.

In a further elaboration of the invention, the width of the slits decreases in the direction of the longitudinal central axis of the examination space from the center of the coil system towards its ends. When the coil system in accordance with the invention is tuned to resonance, in the center of the length of the conductor segments there are present amplitude maxima of the R.F. currents ("current antinodes") which correspond to minima of the electrical voltage ("voltage nodes") on the conductor segments and hence of the R.F. electrical field radiated by the conductor segments. This voltage increases towards the ends of the conductor segments. Consequently, the effectiveness of the shielding of the R.F. electrical field must increase towards the ends of the conductor segments; this is achieved by way of the described decrease of the with of the slits in the direction of the ends of the conductor segments.

In a further elaboration of the invention, the inner screen is constructed so as to be closed at the area of the plane which extends through the longitudinal central axis and with respect to which the conductor groups are symmetrically arranged as well as at the area of the conductors which are oriented in the circumferential direction. The inner shield is thus impermeable to R.F. electrical and magnetic alternating fields at these areas. At these areas, therefore, no slits of the described type or other cut-outs are provided. The space of the coil system in accordance with the invention in which the plane which extends through the central longitudinal axis and with respect to which the conductor groups are symmetrically arranged intersects the inner as well as the outer shield so that it is situated at the circumference of the examination space, exhibits a comparatively low density of the field lines of the R.F. magnetic alternating field. Therefore, it is also referred to as a "neutral zone". The construction of, for example the inner shield at this area has a smaller effect on the shape of the R.F. magnetic alternating field than the construction of, for example, the inner shield at a different area at the circumference of the examination space. Notably the construction of the inner shield does not have a significant effect on the radiation of the magnetic alternating field into the examination space at this area. Thanks to the closed construction of the inner shield at the area of the conductors oriented in the circumferential direction, the effect of the R.F. electrical and magnetic alternating field of these conductors on the field in the examination space is suppressed.

In a further elaboration of the invention, the connection leads are arranged over their entire length in the area of the inner screen in which the latter is constructed so as to be closed. Consequently, influencing, i.e. disturbing of the R.F. magnetic alternating field by the connection leads is avoided. In as far as the connection leads themselves comprise a shield, it is electrically conductivity connected to the inner screen in at least one location, and preferably also to the outer screen, in order to form a common ground so that uncontrolled R.F. currents in the shields and hence field distortions in the examination space are avoided.

In a further elaboration of the invention, the inner shield and the outer shield are interconnected at the ends of the coil system by radially arranged conductor strips. These conductor strips shield the R.F. electrical fields at the ends of the conductor segments and the conductors oriented in the circumferential direction from the examination space and the surroundings of the coil system. On the one hand, capacitive coupling to the body to be measured and resultant resonance shifts and deterioration of the image quality in nuclear magnetic resonance tomography are thus avoided, while on the other hand the body to be measured cannot be endangered by the electrical fields.

In a further elaboration of the invention, the shield has at least partly a layer construction. The shield can then be made, for example of one of more sheets of an electrically conductive material or of a foil or similar material. Such a construction saves materials and weight.

In a further elaboration of the invention, the shield is arranged on a non-conductive support. The support may be made, for example of plexiglass or another dielectric material. On the one hand, it forms a low-weight stable support for the shield and on the other hand provides electrical insulation, for example between the shield and the examination space in order to protect the body to be measured, or between the shield and the conductor segments in order to prevent electrical flash-overs. The shield can be provided on the support, for example as a foil or a vapour-deposited layer.

In a further elaboration of the invention, the shield has a net-like construction. In that case it is preferably composed of a gauze. Such a gauze is mechanically stable, in expensive and easy to work.

Furthermore, the shield is preferably constructed so that it remains permeable for L.F. alternating magnetic fields in the frequency range around a few kHz. Such magnetic fields, also referred to as gradient magnetic fields, are superposed on the primary magnetic field in nuclear magnetic resonance tomography for the imaging scanning of the body to be measured. Such gradient magnetic fields are produced by gradient coils which are arranged outside the R.F. coil system. The building up in time of the gradient magnetic fields in the examination space is then delayed by eddy currents in the electrically conductive parts of the R.F. coil system. When the R.F. coil system must be permeable to the gradient magnetic fields, this delay may not be noticeable with respect to the variation in time of the gradient magnetic fields. The time constant for the decay of the eddy currents produced by the gradient magnetic fields must then be essentially smaller than the rise time of the gradient magnetic fields; thus, in the above example it must be substantially smaller than one ms.

Thus, in a further elaboration of the invention, the shield is constructed so as to have a layer thickness of about a few skin effect penetration depths at the frequency of the R.F. current. For example, the layer thickness may amount to three skin effect penetration depths at the operating frequency of the coil system. The effect of the layer thickness on the conductivity for R.F. electrical currents can then be ignored, while for the L.F. eddy currents produced by the gradient magnetic fields, the shield has a sufficiently high damping resistance.

The net-like construction of the shield, notably in the form of a gauze, is also attractive for fast decay of the eddy currents produced by the gradient magnetic fields. However, when a wire gauze is used, the quality factor of the vacant coil system, i.e. prior to the introduction of the body to be measured, is reduced due to the lower effective surface conductivity in comparison with an electrically conductive layer which is closed in itself. This reduction of the quality factor, however, is small in comparison with the reduction of the quality factor which is caused by the introduction of the body to be measured, so that when use is made of a gauze for the outer screen, only a negligibly small reduction of the effective quality factor occurs when the body to be measured has been introduced.

In a further elaboration of the invention, the conductor segments and/or the conductors which are oriented in the circumferential direction are constructed as thin-walled, conductive tubes. Together with the conductors which are oriented in the circumferential direction, the conductor segments form suitably conductive, closed loops which are capable of exerting a strong effect on the delay of the gradient fields. By constructing the conductor segments as thin-walled tubes, the ohmic resistance of the loop is increased with a substantially unchanged self-inductance to such an extent that the time constant for the decay of the eddy currents produced in the loop becomes essentially smaller than the rise time of the gradient magnetic fields in nuclear magnetic resonance tomography. Adverse effects of the conductor segments on, for example the image quality in nuclear magnetic resonance tomography are thus avoided.

In a further elaboration of the invention, the outer shield and the inner shield are arranged so as to be essentially concentric with respect to the longitudinal central axis of the examination space. In that case, and essentially hollow-cylindrical intermediate space is formed between the outer shield and the inner shield. The intermediate space allows for a shielded arrangement of the conductor segments, connection leads as well as any additional parts, for example for adaptation and tuning of the coil system. The diameter of the inner shield is then determined by the dimensions of the body to be measured, that is to say by the human body or parts thereof in medical applications. As to the diameter of the outer shield, on the one hand the space requirements of the conductor segments and connection leads and, on the other hand, the space available for the coil system in an arrangement producing the static homogeneous primary magnetic field must be taken into account.

In a further elaboration of the invention, the cross-sectional contour of the examination space enclosed by the inner shield is essentially elliptical in a plane perpendicular to the longitudinal central axis. This construction of the inner shield is particularly attractive for nuclear magnetic resonance tomography on the human body because of the substantially elliptical general cross-section thereof. In comparison with a circular cross-sectional contour of the examination space in the plane perpendicular to the longitudinal central axis, the inner shield is now arranged nearer to the patient at the area of the thorax, the abdomen and the dorsum, so that the conductor segments can also be arranged nearer to the patient, that is to say to the body to be measured. Because the field strength of the R.F. magnetic alternating field decreases approximately inversely proportionally to the perpendicular distance from the conductor segment in the case of an R.F. electrical current having a given amplitude in a conductor segment, and the coupling of the relaxation signals from the body to be measured to the conductor segments decreases to the same extent, the sensitivity of the R.F. coil system is increased by the reduction of the distances between the conductor segments and the body to be measured, because the power of the R.F. magnetic alternating field which is necessary for the excitation of the nuclear magnetic resonance decreases and the signal-to-noise ratio increases. Moreover, when the outer shield remains the same, the distance between this shield and the conductor segments changes, so that the homogeneity of the R.F. magnetic alternating field in the examination phase is improved.

In a further elaboration of the invention, the outer shield and the inner shield have at least substantially the same radius of curvature. This results in a structural simplification in that the same components can be used, for example tube segments of the same diameter, for the inner shield and the outer shield or for the non-conductive carriers for the inner shield and the outer shield.

In a further elaboration of the invention, the shield consists of two sections which are closed in themselves. Each section forms a shielding cage comprising a part of the inner shield and a part of the outer shield. The distance between said sections is adjustable in the direction perpendicular to the longitudinal central axis of the examination space. The size of the examination space can thus be adjusted to the dimensions of the relevant body to be examined. Thus, for each body to be measured, the distances between the body and the conductor segments can be adjusted in order to achieve the described improvements of the sensitivity of the coil system.

In a further elaboration of the invention, the shielding cages are displaceable with respect to one another in a direction perpendicular to the longitudinal central axis of the examination space. For example, the shielding cages are mounted on rail-like guides which ensure constant parallel alignment of the conductor segments with respect to one another even when the distance between the shielding cages changes.

In a further elaboration of the invention, the shielding cages are arranged so as to be pivotable with respect to one another about an axis which is situated in the plane with respect to which the conductor groups are symmetrically oriented and which extends parallel to the longitudinal central axis. This can be achieved, for example, by interconnecting the shielding cages by means of a swivel joint at the area of the "neutral zone". The coil system can thus be folded open so that the body to be measured need no longer be axially introduced into the examination space, that is to say in the direction of the longitudinal central axis, but rather in the radial direction with respect to the longitudinal central axis. The handling of the coil system is thus substantially simplified, notably in the case of nuclear magnetic resonance tomography on the human body.

In a further elaboration of the invention, the connection leads are constructed so as to be flexible. The connection leads are notably constructed as flexible coaxial leads. Consequently, on the one hand the construction of the coil system, i.e. the laying of the connection leads, is simplified. On the other hand, a simple connection is obtained between those parts of the coil system whose spacing is variable.

In a further elaboration of the invention, the conductor segments have a barrel-like curvature with respect to the longitudinal central axis of the examination space. In the case of parallel arrangement of straight conductor segments, it has been found that the field strength of the R.F. magnetic alternating field decreases from the centre of the conductor segments in the direction of their ends. This decrease can be compensated for, thus improving the homogeneity of the R.F. magnetic alternating field in the direction of the longitudinal central axis, by a gradual reduction of the distances between the conductor segments and the longitudinal central axis of the examination space in the direction of their ends.

If desired, in addition to the already described resonance oscillation in the coil system where the current antinodes and corresponding "voltage nodes" are situated in the center of the length of the conductor segments, a further oscillation can be excited on the coil system where the "voltage antinodes" and corresponding "current nodes" are situated in the center of the length of the conductor segments. Such a type of oscillation is undesirable on the R.F. coil system, because it consumes R.F. electromagnetic energy and produces an R.F. electrical field around the conductor segments. In order to suppress this type of oscillation, in a further elaboration of the invention, additional lead portions are connected, by way of a first end, to connection terminals between the connection leads and the conductors which are oriented in the circumferential direction of the examination space. These additional lead portions have little influence on the resonance frequency of the desired type of oscillation on the coil system, while the resonance frequency of the undesired type of oscillation is substantially reduced. Coupling (degeneration) of the two types of oscillation is thus inhibited because of the increased frequency distance between their resonance frequencies. When R.F. electrical currents are excited in the conductor segments with a given frequency, only one of the two types of oscillation will thus be excited, namely the desired type which produces the "current antinodes" in the conductor segments.

In a further elaboration of the invention, the additional lead portions are coaxial leads which float at their second end. Due to the coaxial construction of the additional lead portions, fields produced by them have no effect on the R.F. magnetic alternating fields in the examination space. Preferably, the additional lead portions can be arranged parallel to the conductors oriented in the circumferential direction so that they are separated from the examination space by a section of the inner shield which is closed in itself.

In a further elaboration of the invention, an electrically conductive coupling loop is arranged between the inner shield and the outer shield at the area of at least one conductor group and symmetrically with respect to the conductor segments thereof. The loop extends essentially parallel to the longitudinal central axis of the examination space, its first end being connected to the outer shield whilst its second end receives R.F. electromagnetic energy. Via the electrically conductive coupling loop, the coil system is excited to resonance oscillations whose currents produce the R.F. magnetic alternating field in the examination space. Conversely, in the case of nuclear magnetic resonance tomography, the relaxation signals can be transmitted from the body to be measured to the coupling loop via the R.F. coil system in order to be applied to a receiving device. In that case, there is preferably provided a switching device whereby the coupling loop is alternately connected to a source for the supply of R.F. electromagnetic energy and to a receiving device for the reception and evaluation of the relaxation signals. In that case only one coupling loop is required for the coil system.

In a further elaboration of the invention, the coupling loop is deformable so that the surface area enclosed by it and the outer shield is variable. The coupling loop can thus be simply adapted to the characteristic impedance of a connection lead through which the R.F. electromagnetic energy is supplied and the relaxation signals are carried off. When the coupling loop is constructed in this manner, the use of expensive R.F. high voltage capacitors is also avoided.

In a further elaboration of the invention, an auxiliary conductor is arranged parallel to the longitudinal central axis of the examination space and at the circumference thereof, and possible essentially parallel to the coupling loop to each conductor group. The auxiliary conductor is connected to the conductors which are oriented in the circumferential direction. Such an auxiliary lead, which is arranged parallel to the coupling loop to a conductor group, improves the coupling of the R.F. electromagnetic energy from the coupling loop to the coil system. For reasons of symmetry, each conductor group has a similar auxiliary conductor.

In a further elaboration of the invention, the R.F. electromagnetic energy is applied to the second end of the coupling loop via a variable capacitor which adapts the coupling loop to the characteristic impedance of the connection lead. The coupling loop may then have a rigid and possible mechanically more stable construction.

In a further elaboration of the invention, at least one of the connection leads has a tap through which R.F. electromagnetic energy is applied to the loop formed by connection leads and conductors. When the R.F. electromagnetic energy is applied in this manner, the coupling loop and the auxiliary conductor may be dispensed with, so that the arrangement of the conductors is particularly simple. The supply tapping is preferably provided at an area of the connection lead where a "voltage antinode" is formed for the desired type of oscillation at the operating frequency of the coil system. However, the supply tapping may also be arranged at a given distance from this "voltage antinode". This distance can be used to the characteristic impedance between the connection lead connected to the supply tap and the coil system. Such an adaptation of the characteristic impedance is also obtained in a further elaboration of the invention by supplying the R.F. electromagnetic energy from the connection lead via a variable capacitor.

For use in nuclear magnetic resonance tomography, the resonance frequency of the coil system in accordance with the invention must be tunable by a few per cent. This is notably due to the fact that when the body to be measured is introduced into the coil system, the resonance frequency thereof changes as well as the load formed for the connection lead by the coil system. The resonance frequency of the coil system may also be shifted by the adjustment, for example, of the surface are between the coupling loop and the outer shield or the capacitors through which the R.F. electromagnetic energy is supplied, which is necessary for adaptation of the load, i.e. of the characteristic impedance. The tuning of the resonance frequency to the value determined by the induction of the primary magnetic field for the nuclear magnetic resonance to be measured is performed in a further elaboration of the invention in that the second end of the coupling loop is connected to the outer shield via a variable capacitor.

Using hardly any additional circuitry, a substantially larger frequency tuning range can be achieved in a further elaboration of the invention in that each of the connection leads is provided with a tuning through which each is connected to the shield via a variable capacitor. The tuning taps are preferably provided at the areas of the connection leads where "voltage antinodes" are present at the resonance frequency, i.e. at the operating frequency of the coil system. In order to obtain a symmetrical arrangement, each connection lead has a tuning tap.

In a further elaboration of the invention, each of the connection leads has a tuning each connected to one end of a coaxial tuning lead. The sheath of said tuning leads is connected to the shield and its length is variable. For this arrangement of the tuning taps, the same is applicable as before. When use is made of adjustable coaxial leads, so-called "R.F. trombones", variable R.F. high voltage capacitors can be dispensed with.

A particularly simple and reliable tuning device is obtained in a further elaboration of the invention is that the tuning leads float at their second end. A dielectric is arranged inside the sheath so as to be slidable in the longitudinal direction of the lead. Such tuning leads can be very inexpensively manufactured and do not have movable d.c. contacts so that reliable operation without maintenance is ensured for prolonged periods of time.

BRIEF DESCRIPTION OF THE DRAWINGS

Some embodiments in accordance with the invention will be described in detail hereinafter with reference to the drawing. Therein.

DETAILED DESCRIPTION OF THE PREFERRED EMBODIMENT

Figure 1:
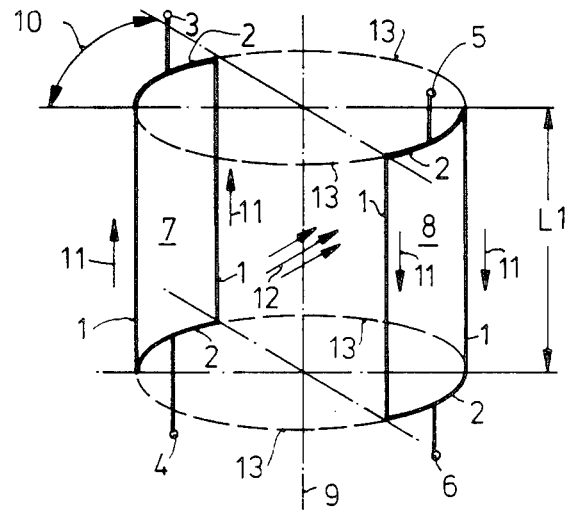
FIG. 1 diagrammatically shows the arrangement of the conductor segments for an example of a coil system in accordance with the invention, FIG. 2 diagrammatically shows an example of an arrangement of the connection leads for the example shown in FIG. 1, FIG. 3 diagrammatically shows a further example of an arrangement of the connection leads for the example shown in FIG. 1.

FIG. 1 diagrammatically shows the arrangement of the conductor segments 1 for a simple embodiment of a coil system in accordance with the invention. At each pair of neighbouring ends, the two conductor segments 1 are interconnected by means of conductors 2. Conductors 2 are oriented in the circumferential direction and are also connected to connection terminals 3, 4, 5, 6 in order to form a first conductor group 7 and a second conductor group 8. The conductor segments 1 and the conductors 2 oriented in the circumferential direction are arranged on the circumference of an examination space which has a circular-cylindrical shape in this embodiment. The contour of the examination space is denoted by broken lines 13 and its longitudinal central axis is denoted by a dash/dot line 9. The conductor segments 1 of each of the two conductor groups 7, 8 enclose a circumferential angle 10 with respect to the longitudinal central axis 9 of the examination space. That angle is 60° in the described embodiment.

Via the connection terminals 3, 4, 5, 6, the conductor segments 1 receive R.F. electrical currents whose directions at a reference instant, for example, of an instant at which they reach their positive amplitude value, are denoted by arrows 11. The currents in all conductor segments always have the same value at any instant. In the examination space, they produce a substantially homogeneous R.F. magnetic alternating field whose field lines extend essentially parallel to one another, thus forming a bundle of field lines which extends perpendicularly to the longitudinal central axis 9 of the examination space.

Figure 2:
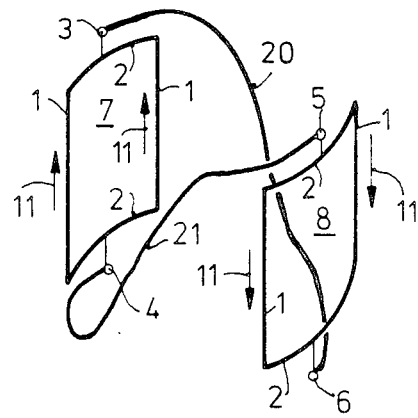

FIG. 2 shows one possible connection of the condudtor groups 7, 8 in order to form a closed loop. A first connection lead 20 interconnects the connection terminals 3 and 6, while a second connection lead 21 interconnects the connection terminals 4 and 5. The length of the connection leads 20, 21 is chosen so that an amplitude maximum ("current antinode") is formed in the center of each conductor segment 1 at the operating frequency of the R.F. electrical currents, while therebetween an amplitude minimum ("current node") is situated in the center of each connection lead 20, 21. Between the electrical currents of the first conductor group 7 on one side and the second conductor group 8 on the other side, a phase shift of 180° then occurs. Due to the "crossing" connection leads 20, 21, the directions denoted by the arrows 11 are obtained for the R.F. electrical currents in the conductor segments 1.

Figure 3:
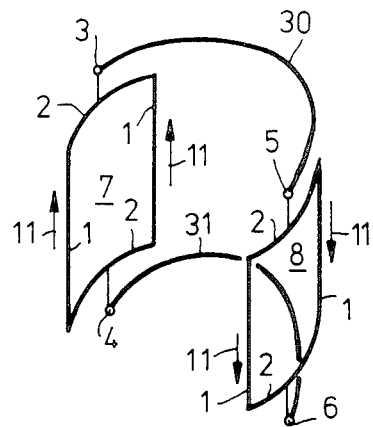

FIG. 3 shows a diagram for the arrangement of connection leads for a further embodiment. Therein, a connection lead 30 interconnects the connection terminals 3 and 5, while a connection lead 31 interconnects the connection terminals 4 and 6. The connection leads 30 and 31 have a length such that at the operating frequency of the R.F. electrical currents, a "current antinode" is formed in the center of each conductor segment 1, while therebetween two "current nodes" are formed in the center of each connection lead 30, 31. For the same operating frequency, the connection leads 30, 31 are longer than the connection leads 20, 21 of FIG. 2. Thus, a phase shift of 360° exists between the currents of the first conductor group 7 on one side and the second conductor group 8 on the other side. This arrangement of the connection leads 30, 31 again produces the current directions denoted by the arrows 11. Such an increased length of the connection leads 30, 31 with respect to the connection leads 20, 21 of FIG. 2 may be desirable when the (geometrical) length of the connection leads 20, 21 is insufficient for a desired structural design of the coil system.

Figure 4:
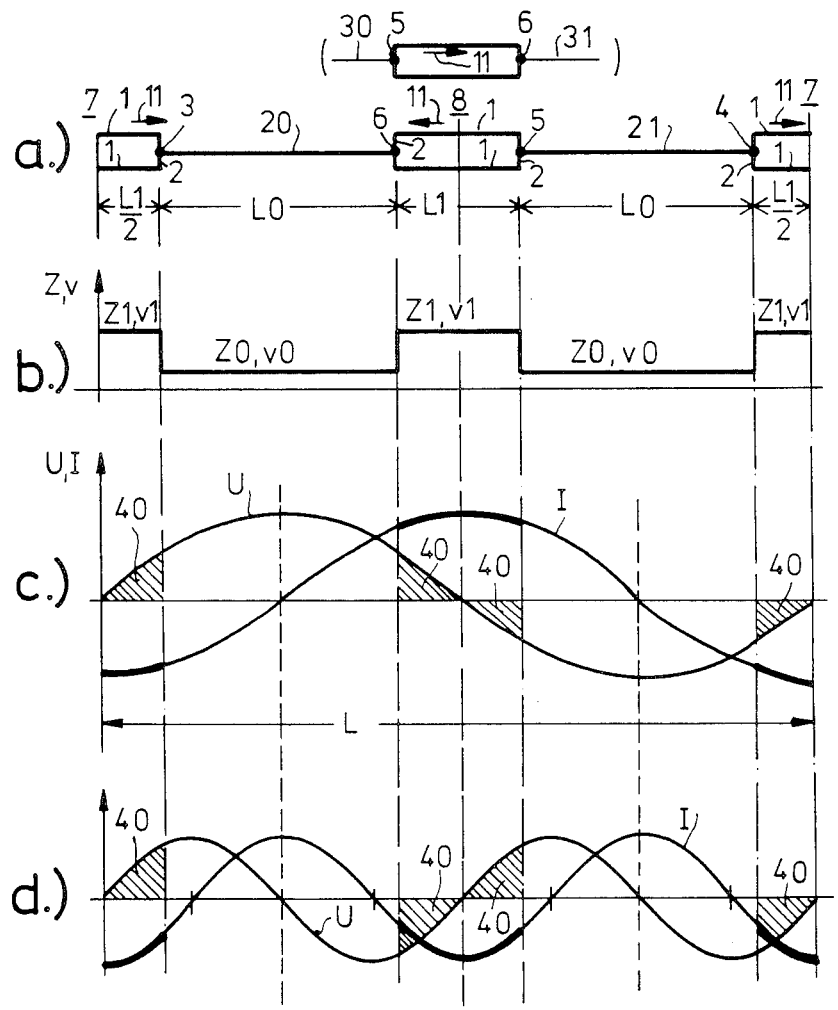
FIG. 4 shows characteristic impedances, propagation speeds, voltages and currents for coil systems as shown in the FIGS. 2 and 3.

FIG. 4a diagrammatically shows the closed loop formed by the conductor groups 7, 8 and the connection leads 20, 21 as an elongate development. Between brackets, moreover, the variations are shown which occur with respect to a coil system as shown in FIG. 3. As in the other Figures, corresponding parts are denoted by identical reference numerals.

The conductor segments 1 have a length L1, while the connection leads 20, 21, 30, 31 have a length L0. The effect of the conductors 2 which are oriented in the circumferential direction is taken into account, for example in the length L1 of the conductor segments 1 by a slight increase of the values of the geometrical lengths thereof.

FIG. 4b shows an example of the variations along the loop of the characteristic impedances Z and the propagation speeds v which are decisive for the propagation of the R.F. electrical currents on the conductor segments 1 and the connection leads 20, 21 and 30, 31. In the example shown, the conductor segments have high characteristic impedances Z1 and high propagation speeds v1. However, the connection leads 20, 21 and 30, 31 have low characteristic impedances Z0 and low propagation speeds V0. Thus, it is achieved that for a geometrical length which is imposed by the predetermined volume of the coil system, the conductor segments 1 have a minimum electrical length, or that they may have an increased geometrical length for a maximum electrical length imposed by the maximum permissible deformation of the R.F. magnetic alternating field, while the connection leads 20, 21, 30, 31 whose electrical lengths are given by the required distribution of "current antinodes" and "current nodes" at the operating frequency, are as short as possible.

FIG. 4c shows the variations of the R.F. electrical currents and voltages along the length of the closed loop in the case of resonance in an arrangement as shown in FIG. 2. The overall length of the loop, measured across the conductor groups 7, 8 and the connection leads 20, 21, is denoted by the reference character L. In the centers of the conductor segments 1, that is to say in the centers of the conductor groups 7, 8, there are situated "current antinodes" and corresponding "voltage nodes". Due to the infinite electrical lengths of the conductor segments 1, the current intensity I decreases towards the ends of the conductor segments 1, but this decrease is only slight in accordance with the sine function. The voltage U on the conductor segments 1 increases on both sides of the "voltage nodes" in the direction of the ends of the conductor segments, so that on the conductor segments 1 voltages are formed in accordance with the shaded curve sections 40 in FIG. 4c. In order to keep the decrease of the current intensity I on the conductor segments 1 in the direction of their ends, causing an attenuation of the R.F. magnetic field, within acceptable limits, and in order to ensure that the voltages U at the ends of the conductor segments cannot become excessively high, the length of the conductor segments L1 should be restricted to ⅛ of the wavelength.

When the conductor groups 7, 8 are connected by means of connection leads 30, 31 as shown in FIG. 3, a distribution of the voltage U and the current intensity I as shown in FIG. 4d is obtained along the overall length L of the loop. On the connection leads 30, 31 two "current nodes" are situated, whilst one "current antinode" is situated therebetween. Whilst the frequency range in which the arrangement shown in FIG. 2 can be used is limited mainly by the length of the connection leads 20, 21 in practical coil systems, operation at higher frequencies is possible with a coil system as shown in FIG. 3 which comprises the electrically longer connection leads 30, 31. Therein, the frequency range is limited mainly by the predetermined length of the conductor segments 1.

Figure 5:
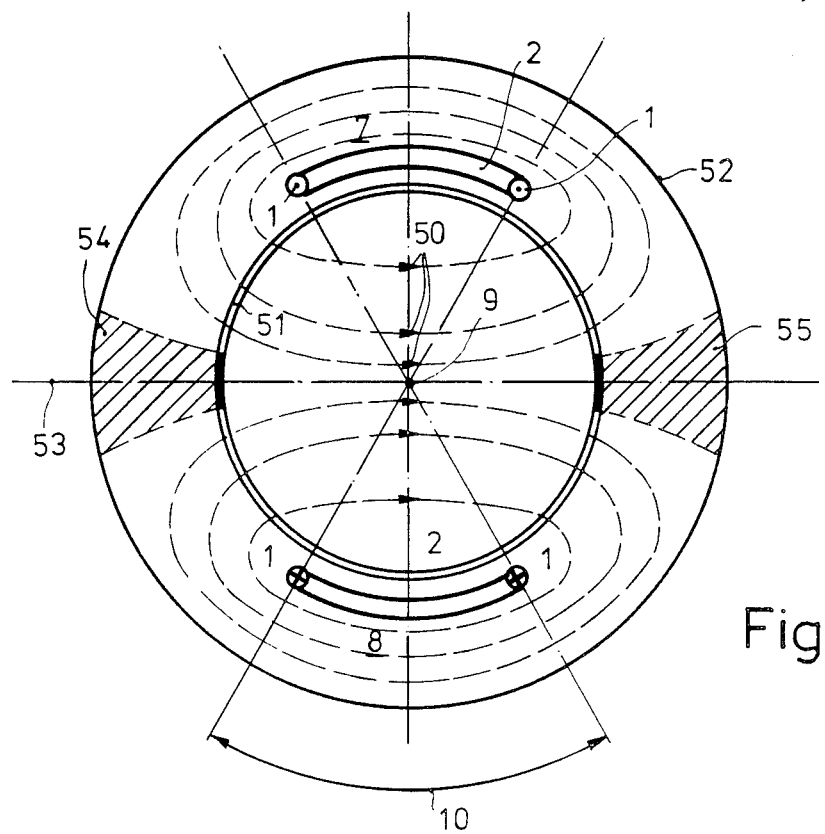
FIG. 5 is a diagrammatic cross-sectional view through a coil system in accordance with the invention, taken perpendicularly to its longitudinal central axis, FIG. 6 diagrammatically shows the arrangement of conductor segments and the inner and outer shield in a coil system in accordance with the invention.

FIG. 5 is a cross-sectional view of a further embodiment taken perpendicularly to the longitudinal central axis 9 of the examination space. The conductor segments 1 of the conductor groups 7 and 8 extend perpendicularly to the plane of drawing and are shown in a cross-sectional view. For the conductor segments 1 of the first conductor group 7, the R.F. electrical current is shown to flow out of the plane of drawing. For the conductor segments 1 at the second conductor group 8 the current is shown to flow into the plane of drawing. The broken lines 50 with the arrows represent the variation and the direction of the R.F. magnetic alternating field produced by the currents in the conductor segments and thus correspond to the arrow 12 in FIG. 1 in this respect. The conductor segments 1 of each conductor group 7, 8 are arranged so as to enclose a circumferential angle 10 with respect to the longitudinal central axis 9 of the examination space; this angle again amounts to 60°. With this angle, a particularly homogeneous variation of the R.F. magnetic alternating field in the examination space is obtained with the present coil system comprised of four conductor segments.

Between the conductor groups 7, 8 and the examination space, there is also arranged an inner shield 51 of an electrically conductive material which encloses the examination space and which shields this space from electrical fields produced by the conductor groups 7, 8. The shield is constructed so that no significant induction currents are produced therein by the R.F. magnetic alternating fields. The result is that the shield permeable to the R.F. magnetic alternating fields. The complete coil system is enclosed by an outer shield 52 which inhibits the expansion of the electric and magnetic fields produced by the coil system.

In the space between the inner shield 51 and the outer shield 52, so-called neutral zones 54, 55 are denoted by shading at the area of a symmetry plane 53 which extends through the longitudinal central axis 9 of the examination space and with respect to which the conductor groups 7, 8 are symmetrically arranged. In comparison with the other zones within the outer shield 52, the R.F. magnetic alternating field is comparatively weak in these neutral zones 54, 55. Modifications of the construction of the coil system in these zones have only minor effects on the R.F. magnetic alternating field in the examination space.

Figure 6:
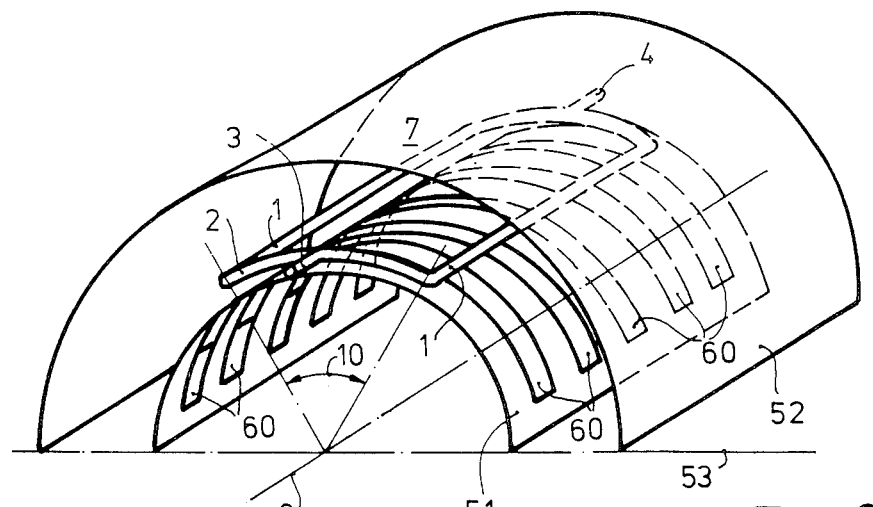

FIG. 6 is a perspective diagrammatic view of the arrangement of the first conductor group 7 between the inner shield 51 and the outer shield 52. The conductor segments 1 are d.c. isolated from the shields 51, 52, but are arranged at as small as possible distance from the inner shield 51 because, in order to obtain as strong as possible R.F. magnetic alternating field, they should extend as near as possible to the examination space which is bounded by the inner shield 51. However, between the conductor segments 1 and the outer shield 52, a larger distance is maintained. Such a larger distance has a favourable effect on the homogeneity of the R.F. magnetic alternating field in the examination space. The inner shield 51 and the outer shield 52 have a layer-like construction. At the area of the conductor segments 1, the inner shield 51 has slits 60 which extend in the circumferential direction of the examination space, i.e. perpendicularly to the conductor segments 1. The outer shield 52, however, has a closed construction. Consequently, the R.F. fields of the conductors segments 1 are shielded completely from the environment of the coil system by the outer shield 52, while the R.F. magnetic alternating field of the conductor segments 1 penetrates into the examination zone via the slits 60 in the inner shield 51. However, the R.F. electrical field of the conductor segments 1 is essentially kept remote from the examination space by the inner shield 51.

Figure 7:
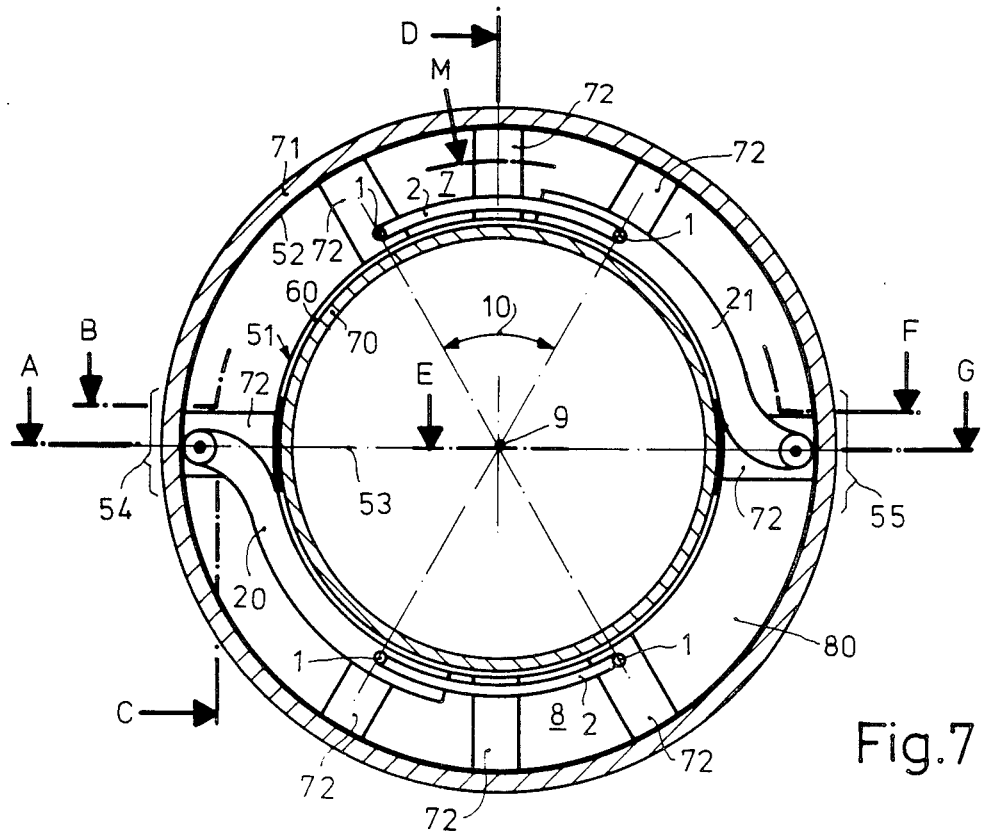
FIG. 7 is a cross-sectional view of a further example of a coil system in accordance with the invention, taken perpendicularly to its longitudinal central axis.

FIG. 7 is a cross-sectional view, taken perpendicularly to the longitudinal central axis 9 of the examination space of a further embodiment of the invention. The inner shield 51 of this embodiment is arranged on a circular-cylindrical, dielectric carrier or support 70 for mechanical stability and also for d.c. isolation from the examination space. As in the embodiments already described, outside the inner shield 51 there are provided two conductor groups 7, 8. Each group is formed by two conductor segments 1 and two conductors 2 which are oriented in the circumferential direction of the examination space. The connection terminals 3, 4, 5, 6 of the conductor groups which are not visible in the sectional view of FIG. 7 are interconnected to two connection leads 20, 21, as in the arrangement shown in FIG. 2. The connection leads each start at one of the connection terminals 3, 4, 5, 6 and extend in the circumferential direction of the examination space along the inner shield 51 as far as the neutral zones 53, 54. From these the leads extend parallel to the longitudinal central axis 9 of the examination space to the other end of the conductor groups 7, 8. The complete arrangement is enclosed by the closed outer shield 52 which is arranged on the inner side of a further dielectric carrier 71 in the present embodiment. The dielectric carrier 71 for the outer shield 52 also has a circular-cylindrical construction and is arranged, like the carrier 70 for the inner shield 51, so as to be concentric with the longitudinal central axis 9 of the examination space. It adds mechanical stability to the outer shield 52 and, at the same time, provides for d.c isolation for the shield from the environment of the coil system. The carriers 70, 71 for the inner shield and the outer shield are made, for example of plexiglass.

At the ends of the coil system the inner shield 51 and the outer shield 52 are electrically conductively interconnected by radially arranged conductor strips 72. These strips are provided notably at the area of the conductors 2 oriented in the circumferential direction as well in the neutral zones 54, 55. They thus shield the electrical field which has its highest electrical field strength on the conductors 2 which are oriented in the circumferential direction. At the area of the neutral zones 54, 55, the connection leads 20, 21 are shielded from the R.F. alternating fields. The inner shield 51 is also constructed so as to be closed at these areas for this purpose. Effects of the connection leads 20, 21 at the area of the neutral zone on the spatial geometry of the R.F. magnetic alternating fields are thus eliminated, so that, for example a non-uniform arrangement of the connection leads 20, 21 or shifts in the position thereof do not influence the homogeneity of the R.F. magnetic alternating field.

In comparison with FIG. 2, the connection leads 20, 21 are arranged on the opposite side of the examination space. It will be apparent that the first connection lead 20 can also be passed through the neutral zone 55 and the second connection lead 21 through the neutral zone 54 without changing the connections to the connection terminals.

Figure 8:
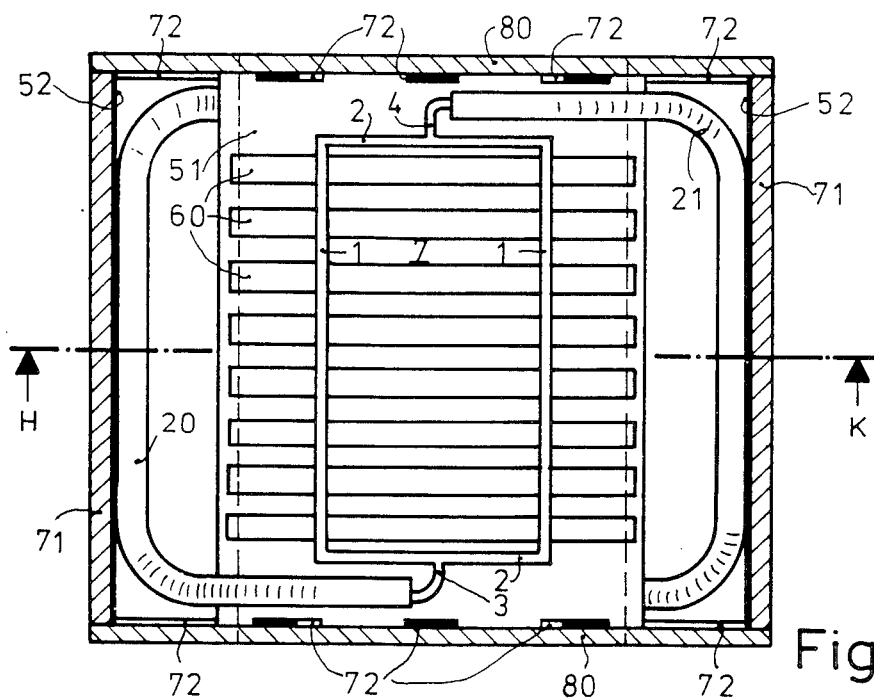
FIG. 8 is a partly exposed plan view of the coil system shown in FIG. 7, FIG. 9 diagrammatically shows a further embodiment in accordance with the invention.

FIG. 8 is a plan view of the coil system shown in FIG. 7 which is partly exposed along the line B-M-F in FIG. 7. The inner shield 51 with the slits 60 oriented in the circumferential direction, and the first conductor group 7 arranged thereabove are shown in a plan view; the outer shield 52 and its surrounding carrier 71 as well as the radial conductor strips 72 which are arranged at the area of the conductors 2 oriented in the circumferential direction as shown in a sectional view. The line H-K represents the cross-section through the coil system shown in FIG. 7. In addition to the parts of the coil system already described and shown in FIG. 7, FIG. 8 shows two insulating lids 80 in a partly sectional view, said lids d.c. isolate the coil system from the environment at its ends and forming a closed insulating housing in conjunction with the carriers 70, 71.

Figure 9:
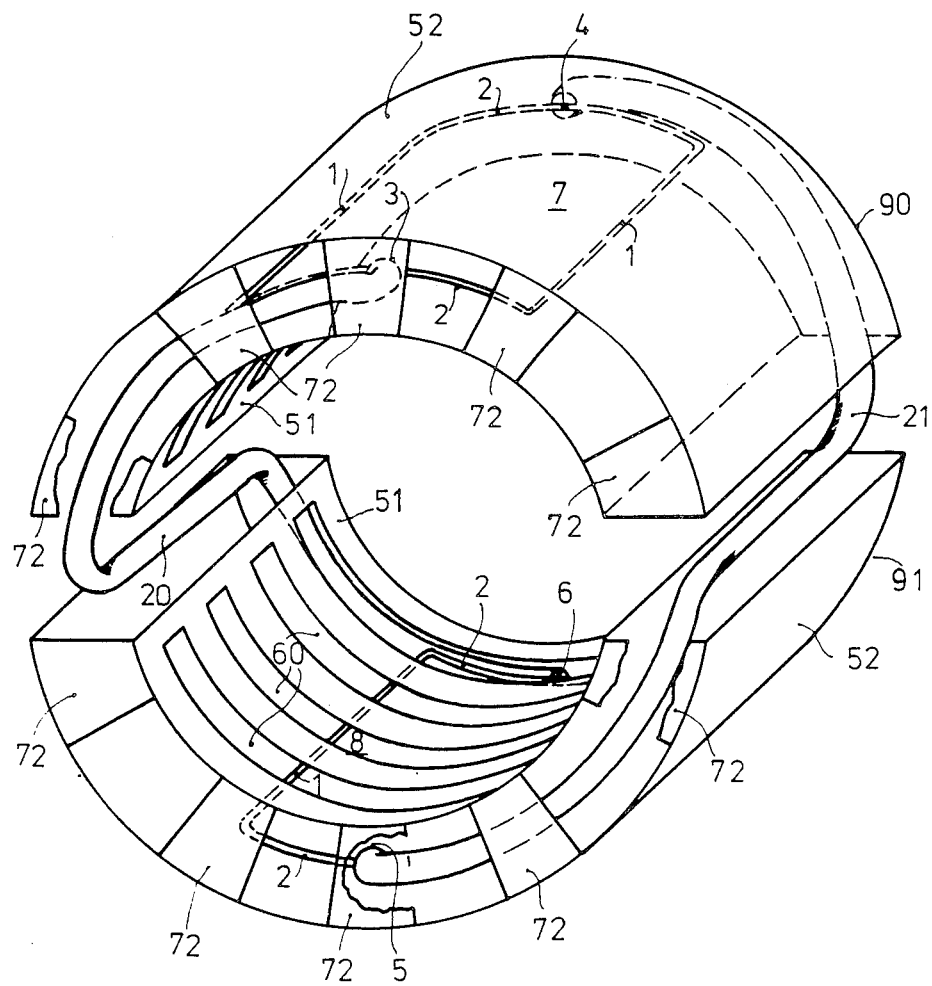

FIG. 9 is a diagrammatic perspective view of a coil system which substantially corresponds to the system shown in FIGS. 7 and 8. Parts which are already known from the preceding Figures are again denoted by corresponding reference numerals. In order to simplify the drawing, the carriers 70, 71 as well as the insulating lids 80 have been omitted and the number of slits 60 in the inner shield 51 has been reduced. The inner shield and the outer shield 51, 52 are shown to be interrupted at the area of the neutral zones 54, 55 in order to clarify the course of the connection leads 20, 21 at these areas. The connection leads 20, 21 are coaxial lead, in the system shown in FIGS. 7 and 8. One difference with respect to the embodiment shown in the FIGS. 7 and 8, however, is that the inner shield 51 and the outer shield 52 can indeed be interrupted at the area of the neutral zones 54, 55 as shown in FIG. 9, without noticeably influencing or changing the geometry of the R.F. magnetic alternating field in the examination space. Using each time one half of the inner shield 51 as well as of the outer shield 52, two closed, separated shielding cages 90, 91 which are interconnected only via the connection leads 20, 21 are thus formed. If the carriers 70, 71 possibly supporting the inner shield 51 and the outer shield 52 are also separated at the area of the neutral zones 54, 55 and if the connection leads 20, 21 are constructed as flexible coaxial cables, a coil system is obtained which consists of two closed sections, each section comprising a shielded conductor group and the distance between the sections being variable.

Figure 10:
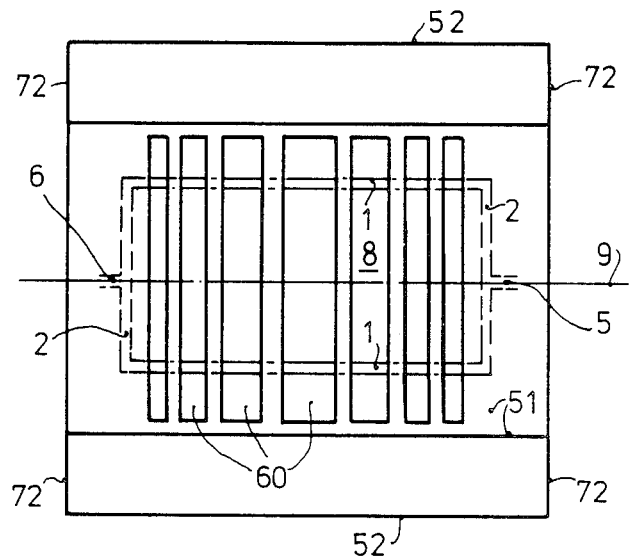
FIG. 10 is a diagrammatic, longitudinal sectional view of a further embodiment in accordance with the invention.

FIG. 10 is a very simplified sectional view taken along the line A-E-G in FIG. 7, of a coil system which corresponds substantially to the system shown in FIG. 1. Contrary to the coil system shown therein, the inner shield 51 of the system shown in FIG. 10 has slits 60 whose widths decrease, measured in the direction of the longitudinal central axis 9 of the examination space, towards the ends of the conductor segments 1. Moreover, as in FIGS. 8 and 9, FIG. 10 shows that the conductors 2 oriented in the circumferential direction as well as the connection leads 20, 21 (see notably FIG. 8) are arranged as areas of the inner shield 51 where the latter is constructed so as to be closed.

Figure 11:
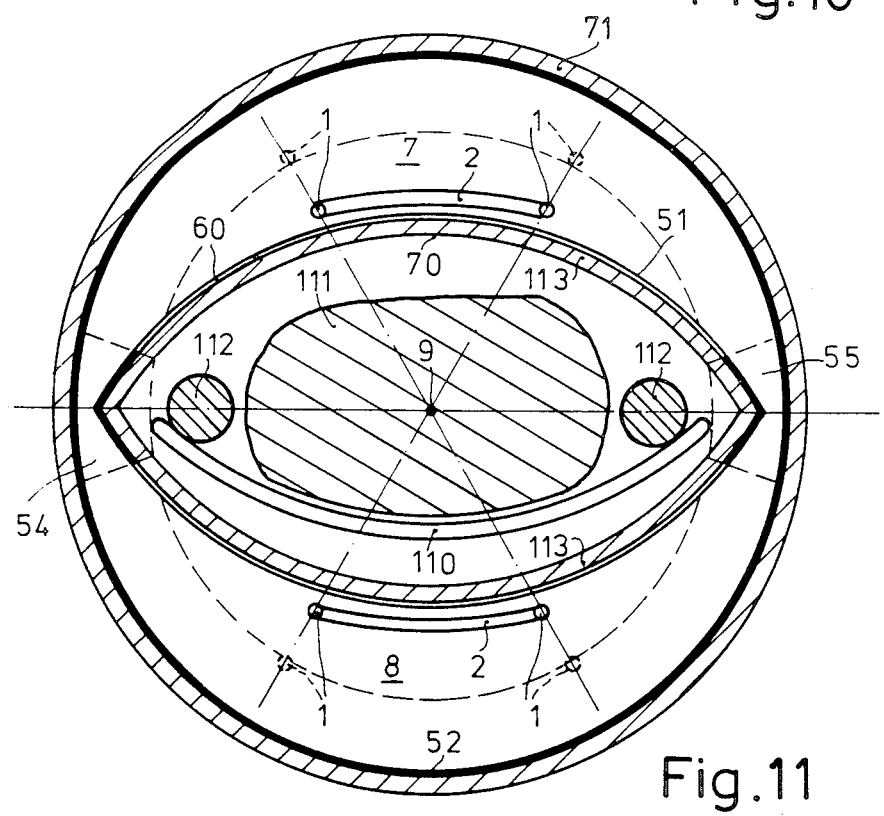
FIG. 11 is a diagrammatic cross-sectional view, taken perpendicularly to the longitudinal central axis, of another embodiment in accordance with the invention.

FIG. 11 is a cross-sectional view of a further embodiment of the coil system in accordance with the invention, taken perpendicularly to the longitudinal central axis of the examination space along the line H-K in FIG. 8. The carrier 71 with the outer shield 52 has not been modified in comparison with the previously described embodiments. The carrier 70 with the inner shield 51, however, now comprises two cylinder surface sections 113 whose radii of curvature correspond to those of the carrier 71 for the outer shield 52. The examination space which is enclosed by the sections 113 of the carrier 70 thus has an essentially elliptical cross-section. For the purpose of comparison, broken circles are used to indicate the cross-sectional contour of a concentric inner shield as used in the systems shown in the FIGS. 7 to 9 and the associated positions of the conductor segments 1. When the inner sheild is constructed as in the present embodiment, the conductor segments 1 are situated nearer to the longitudinal central axis of the examination space and hence nearer to the body to be measured. The sensitivity of the coil system is thus improved. Such an arrangement is particularly suitable for measurements on the human body whose cross-sectional contour is substantially elliptical. Therefore, FIG. 11 shows the cross-section of a human body approximately at the level of the thorax. The reference numeral 11 denotes the cross-section of the thorax, whilst the reference 112 denotes the cross-section of the arms. The human body to be measured is arranged on a table 110 and is introduced into the coil system in the reclined position.

As in the previous embodiments, at the area of the conductor segments 1 the inner shield 51 comprises slits 60 which are oriented in the circumferential direction and is constructed so as to be closed at the area of the neutral zones 54, 55.

Figure 12:
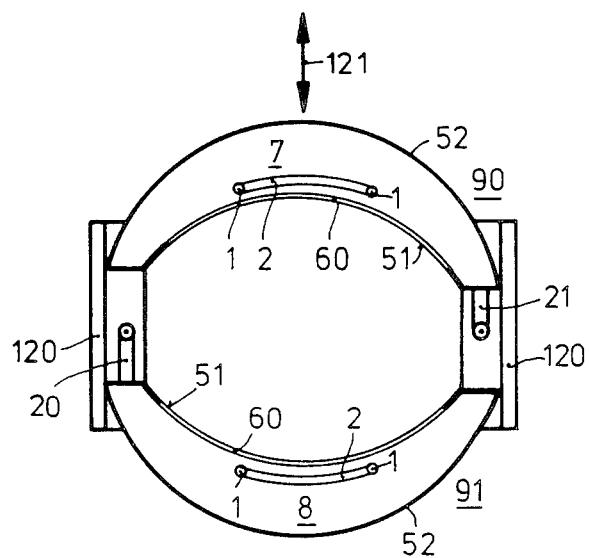
FIG. 12 is a diagrammatic cross-sectional view, taken perpendicularly to the longitudinal central axis, of a further embodiment in accordance with the invention.

FIG. 12 is a very simplified cross-sectional view of a further embodiment of the coil system shown in FIG. 9, taken perpendicularly to the longitudinal central axis of the examination space along the line H-K in FIG. 8. This Figure shows the two closed sheidling cages 90, 91 which are electrically interconnected via the connection leads 20, 21. At the area of the neutral zones of the coil system, the shielding cages 90, 91 are supported by guides 120 which allow for mutual displacement of the shielding cages 90, 91 with the conductor groups 7, 8 perpendicularly to the longitudinal central axis 9 of the examination space. The direction of displacement is denoted by the double arrow 121.

Figure 13:
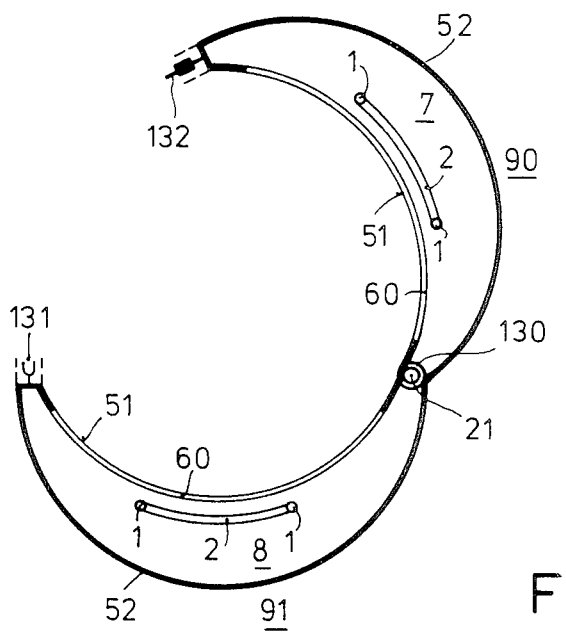
FIG. 13 is a diagrammatic cross-sectional view, taken perpendicularly to the longitudinal central axis, of an example of a different construction of a coil system in accordance with the invention, FIG. 14 diagrammatically shows an example for a further embodiment in accordance with the invention, FIG. 15 diagrammatically shows a modification of the arrangement of the conductor segments of the embodiment shown in FIG. 1.

FIG. 13 similarly shows a further embodiment of a coil system which is substantially identical to that shown in FIG. 12. In comparison with the system shown in FIG. 12, the shielding cages 90, 91 are now pivotably interconnected at the area of the neutral zone 55 by means of a swivel joint 130. This joint preferably comprises a hollow shaft through which passes the second connection lead 21. The first connection lead 20 has an R.F. connector which consists of a shielded plug 132 and a shielded socket 131 and which is disconnected when the shielding cages 90, 91 are swiveled apart.

Figure 14:
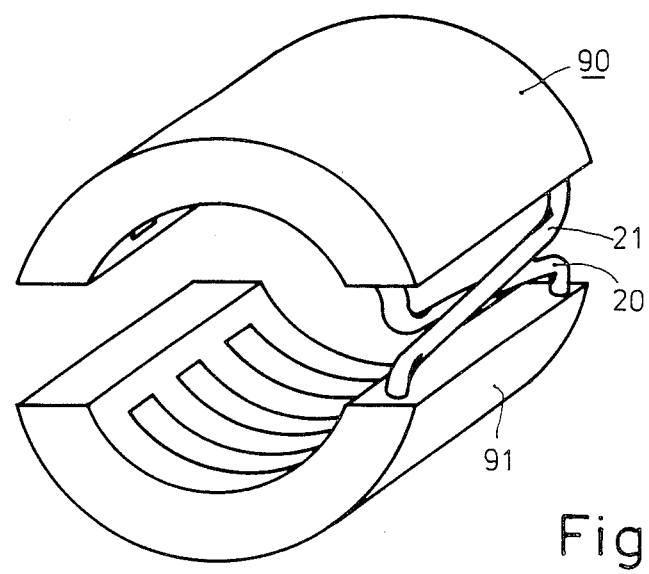

FIG. 14 is a diagrammatic perspective view of a further version of the system shown in FIG. 13. In order to avoid the use of an R.F. connector as used in FIG. 13, both connection leads 20 and 21 in the coil system shown in FIG. 14 are fed through a single neutral zone. Though the symmetry of the coil system is thus slightly affected, an expensive part which is also subject to wear is saved by the omission of the R.F. connector. Both connection leads 20, 21 may be arranged together, for example in a hollow shaft of the joint.

Evidently, in a system as shown in FIG. 13 each of the connection leads 20, 21 may comprise an R.F. connector. The shielding cages 90, 91 can then be completely separated from one another. It is a particular advantage of such a system that, for example for one shielding cage 91, there may be several, differently constructed shielding cages 90, which for example comprise different adaptation or tuning elements and which can be combined with the shielding cage 91 as desired.

Figure 15:
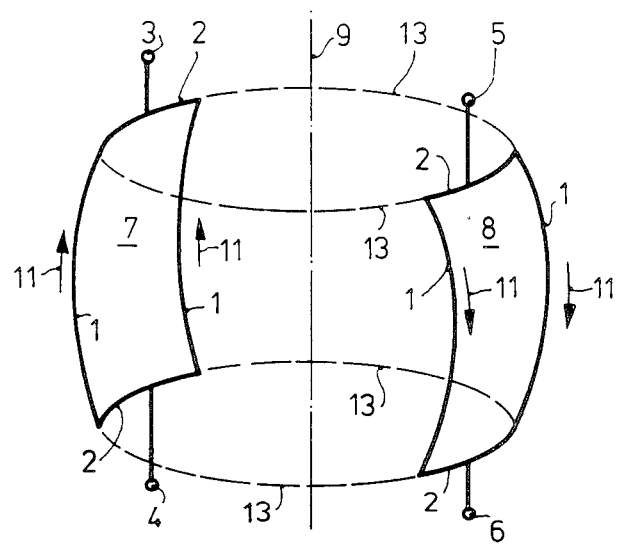

FIG. 15 shows a further version of the diagrammatic representation of FIG. 1 in which the conductor segments 1 are curved so as to be barrel-shaped in the direction of the longitudinal central axis 9 in order to improve the homogeneity of the R.F. magnetic alternating field in the examination space. For the remainder, the description given with reference to FIG. 1 holds good.

Figure 16:
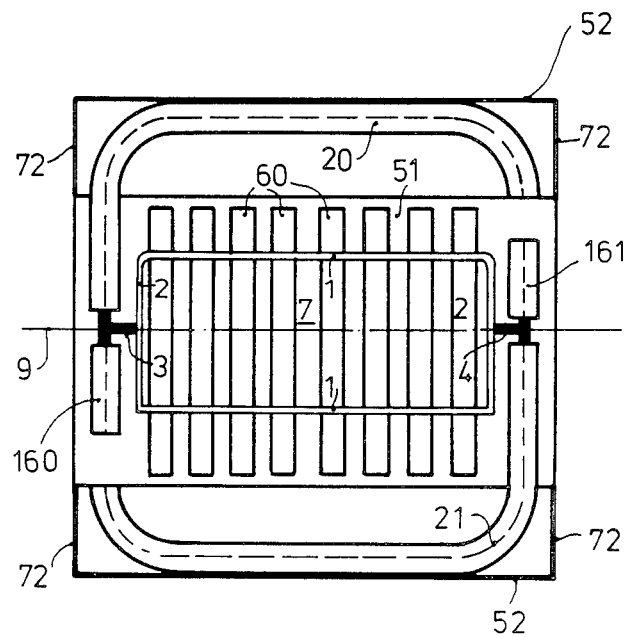
FIG. 16 is a partly exposed diagrammatic plan view of a further embodiment in accordance with the invention.

FIG. 16 is a simplified representation of a coil system shown in FIG. 8, i.e. a sectional view taken along the line B-M-F in FIG. 7. Additional to the system shown in FIG. 8, additional lead portions 160, 161 are connected to each of the connection terminals 3, 4, 5, 6 (the lead portions connected to the connection terminals 5, 6 are not shown). The lead portions are coaxial leads which float at one end and which serve to suppress undesirable types of oscillations on the coil system. At the area of the conductors 2 which are oriented in the circumferential direction, the additional lead portions 160, 161 are arranged so as to extend parallel thereto and behind a closed zone of the inner shield 51 which thus shields these portions from the examination space. It is an additional advantage of the described arrangement of the additional lead portions 160, 161 that the symmetry of all conductive parts is improved at the area of the conductors 2 oriented in the circumferential direction.

Figure 17:
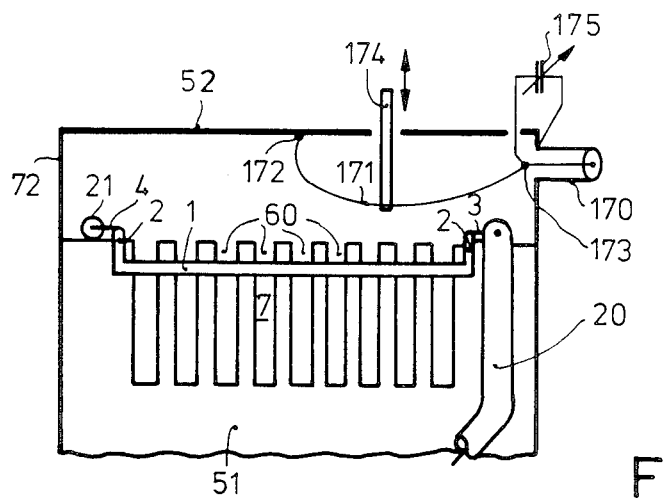
FIG. 17 is a partial diagrammatic sectional view of another embodiment in accordance with the invention, FIG. 18 diagrammatically shows a further embodiment in accordance with the invention, FIG. 19 diagrammatically shows an arrangement of the conductor segments and connection leads in a further embodiment in accordance with the invention, FIG. 20 diagrammatically shows an arrangement of the conductor segments and connection leads in another embodiment in accordance with the invention.

FIG. 17 diagrammatically shows a part of a sectional view of the coil system of FIG. 7, taken along the line C-M-D. In addition to the elements described with reference to FIGS. 7 and 8, the system shown in FIG. 17 comprises a coupling loop 171 which is arranged in the space between the inner shield 51 and the outer shield 52 and radially outside the first conductor group 7, viewed from the longitudinal central axis 9 of the examination space. One end 172 of the coupling loop is connected to the outer shield 52 and the second end 173, to an inner conductor of a coaxial connection lead 170 whose outer conductor is also connected to the outer shield 52. Via the coaxial connection lead 170, the coil system can receive or output R.F. electromagnetic energy. The coupling loop 171 thus serves to couple energy from the inner conductor of the coaxial connection lead 170 to the conductor segments 1 of the first conductor group 7.

Coupling preferably takes place via the magnetic field of the current which flows in the coupling loop 171 and which is applied via the coaxial connection lead 170. The coupling between the coupling loop 171 and the conductor group 7 can be adjusted by variation of the surface area enclosed by the coupling loop 171 and the outer shield 52. To enable adjustment of this surface area, the coupling loop 171 is made of a flexible conductor and is connected to an adjusting member 174 so that the distance between the coupling loop 171 and the outer shield 52 can be varied. Such an adjusting member 174 may be constructed, for example as a screw or a slide.

For fine-tuning of the resonance frequency of the coil system, the second end 173 of the coupling loop 171 is connected to the outer shield 52 via a tuning capacitor 175. The resonance frequency can thus be adjusted by approximately 2%.

By adjustment of the coupling loop 171 by means of the adjusting member 174, not only the coupling is adjusted but also the terminating impedance formed by the coupling loop 171 at the end of the coaxial connection lead 170.

Figure 18:
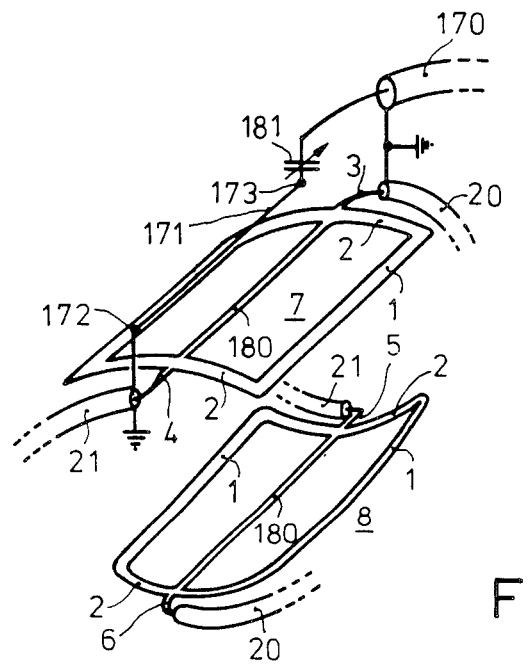

FIG. 18 is a diagrammatic perspective view of a mechanically rigid version of the coupling loop 171. Therein, the magnetic coupling between the coupling loop 171 and the first conductor group 7 is constant. The terminating impedance formed by the coupling loop 171 for the coaxial connection lead 170 is adjusted by a trimming capacitor 181 which is connected in series between the inner conductor of the coaxial connection lead 170 and the second end 173 of the coupling loop 171. The first end 172 of the coupling loop 171 is again connected to ground, i.e. to the outer shield 52, the inner shield 51 or the sheath of the coaxial connection lead 21.

Moreover, in order to increase the magnetic coupling between the coupling loop 171 and the first conductor group 7, an auxiliary conductor 180 is included in the conductor group 7. The auxiliary conductor is arranged parallel to the coupling loop 171 and is connected to the conductor group 7 at the connection terminals 3 and 4. For reasons of symmetry, a similar auxiliary conductor 180 is included in the conductor group 8 and is connected to the connection terminals 5 and 6.

Figure 19:
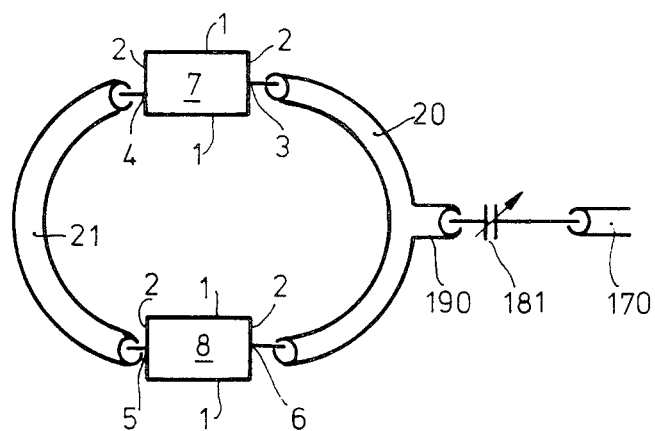

FIG. 19 shows a diagram of the connection of the conductor groups 7, 8 and the connection leads 20, 21 in which the first connection lead 20 has a supply 190 at the area where a voltage antinode is formed during operation at the resonance frequency of the coil system. The tap receives R.F. electromagnetic energy from the connection lead 170. The arrangements shown in the FIGS. 18 and 19 similarly serve to apply the relaxation signals received from the body to be measured from the coil system to a receiving device. Between the supply tapping 190 and the connection lead 170, a trimming capacitor may again be connected in series for trimming or adjustment of the characteristic impedances of the connection lead 170 and the first connection lead 20.

Figure 20:
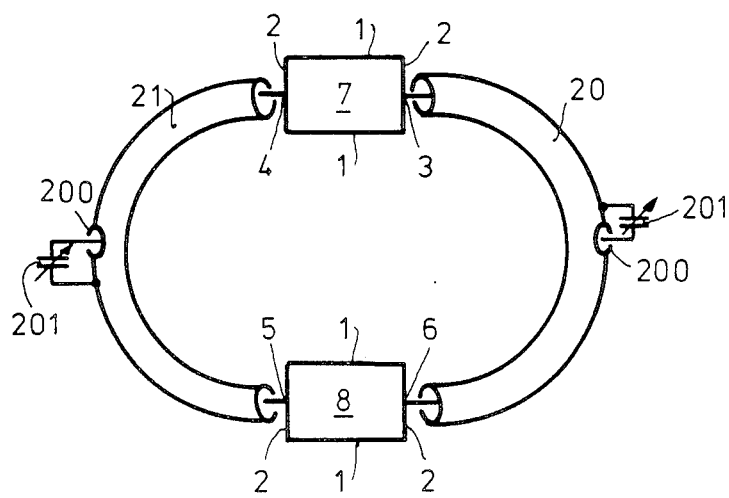

FIG. 20 shows a coil system in a way similar to that used in FIG. 19, the connection leads 20, 21 now comprising tuning taps 200 at the areas where voltage antinodes are formed in the case of resonance of the coil system. The connection leads are bridged by tuning capacitors 201 at the area of the taps. By adjustment of the tuning capacitors 201, the electrical lengths of the connection leads 20, 21 and hence the resonance frequency of the coil system can be changed. For reaseons of symmetry, i.e. in order to prevent shifting of the positions of the current antinodes on the conductor segments 1, the capacitances of the tuning capacitors 201 are chosen to be equal. Such tuning capacitors 201 are capable of simple shifting the resonance frequency by more than 10%.

Figure 21:
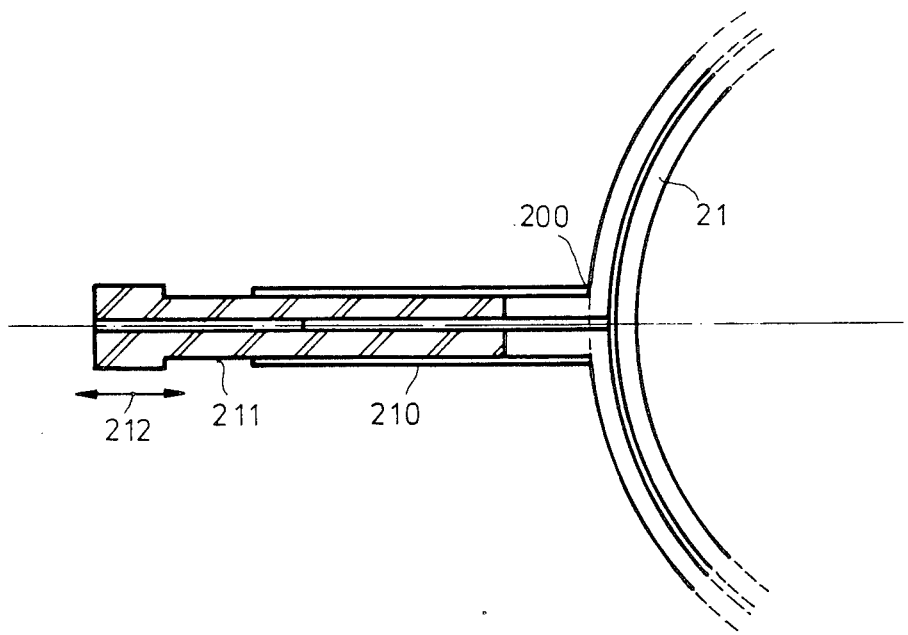
FIG. 21 diagrammatically shows a tuning lead in a coil system in accordance with the invention.

Instead of the tuning capacitors 201 used in the coil system shown in FIG. 20, use can also be made of the tuning leads 210 shown in FIG. 21. These leads consist of a coaxial lead portion which comprises a dielectric 211 which is displaceable in the longitudinal direction. By displacement of the dielectric 211 as indicated by the arrow 212, the electrical length of the tuning lead is changed, and hence also the electrical length of the connected connection lead 20 or 21.

An embodiment of a coil system which is constructed as shown in the FIGS. 7 and 8 comprises an outer shield 52 having a diameter of 52 cm and an inner shield 51 having a diameter of 30 cm. The length L1 of the conductor segments 1 amounts to 31 cm. The conductor segments are made of brass tubes having an outer diameter of 4.8 mm and a wall thickness of 0.1 mm. For these dimensions, the decay time constant for eddy currents induced in a conductor group will be less than 0.1 ms, so that it no longer has a noticeable effect on gradient magnetic fields having frequencies of some kHz. The conductor segments 1 are mounted at a small distance of 10 mm from the inner shield.

The length of L0 of the connection leads 20, 21 amounts to 100 cm in the described system. Use is made of a coaxial cable having a characteristic impedance of 50 ohms and a wave propagation speed of 82% of the velocity of light in vaccumm. Said dimensions result in a characteristic impedance 21 of the conductor groups of approximately 180 ohms; the wave propagation speed corresponds to the velocity of light. The resonance frequency of the system is approximately 66 MHz. The quality factor of the coil system without the body to be measured amounts to 550 and decreases to 163 after the introduction of a human body. In reaction thereto, the resonance frequency is shifted by only 10 kHz, because the R.F. electrical fields are effectively shielded from the body to be measured.

What is claimed is:

1. An RF coil system for generating and/or receiving substantially homogeneous alternating magnetic fields, said system comprising at least four elongated conductor segments disposed about an approximately cylindrical space having a central, longitudinal axis, said conductor segments extending approximately parallel to said central axis and being arranged symmetrically with respect to at least one symmetry plane which extends through said central axis, and means for interconnecting said conductor segments so as to form a closed loop, said interconnecting means comprising a plurality of conductor elements which interconnect adjacent ends of said conductor segments so as to form at least two conductor groups and a plurality of connecting lead which interconnect said conductor groups, said connecting leads being connected to respective conductor elements and having a length such that when an RF current is applied to said coil system, there is a RF current amplitude maximum at approximately the center of each conductor segment and at least one RF current amplitude minimum on each connecting lead.

2. A coil cystem as claimed in claim 1 wherein one of said conductor groups is formed by a first pair of said conductor segments whose ends are connected together by conductor elements which extend circumferentially with respect to said cylindrical space to form a loop and another of said conductor groups is formed by a second pair of said conductor segments whose ends are interconnected together by conductor elements which extend circumferentially with respect to said cylindrical space to form a second loop, said one and said another group of conductors being interconnected by said connecting leads so that upon application of an RF current to said coil system, the currents flowing through said conductor segments of said first pair have the same sense with respect to said central axis and the currents flowing through said conductor segments of said second pair have the same sense with respect to said central axis.

3. A coil system as claimed in claim 1 or 2 wherein said conductor groups and said connecting leads have characteristic impedances, lengths and propagation constants in accordance with the relation:

$$Z0/Z1 = |\tan(\beta 0 \times L0/2) \times \tan(\beta 1 \times L1/2)|$$

wherein Z0 is the characteristic impedance of said connecting leads, Z1 is the characteristic impedance of said conductor groups, L0 is the length of said connecting leads, L1 is the length of said conductor groups, $\beta 0$ is the propagation constant of said connecting leads and $\beta 1$ is the propagation constant of said conductor groups.

4. A coil system as claimed in claim 1 or 2 wherein said conductor groups and said connecting leads have characteristic impedances, lengths and propagation constants in accordance with the relation:

$$Z0/Z1 = |\tan(\beta 1 \times L1/2)/\tan(\beta 0 \times L0/2)|$$

wherein Z0 is the characteristic impedance of sad connecting leads, Z1 is the characteristic impedance of said conductor groups, L0 is the length of said connecting leads, L1 is the length of said conductor groups, $\beta 0$ is the propagation constant of said connecting leads and $\beta 1$ is the propagation constant of said conductor groups.

5. A coil system as claimed in claim 1 or 2 wherein said conductor segments are arranged into two of said conductor groups which are symmetrically oriented with respect to said symmetry plane.

6. A coil system as claimed in claim 2 wherein each pair of conductor segments with currents of the same sense flowing therethrough is arranged so as to enclose a circumferential angle of at least approximately 60° with respect to said central axis of said examination space.

7. A coil system as claimed in claim 1, 2 or 6 comprising an electrically conductive and magnetically permeable shield which is disposed about said conductor segments and is electrically insulated therefrom.

8. A coil system as claimed in claim 7 wherein said shield has a closed section which surrounds all of said conductor segments of one conductor group.

9. A coil system as claimed in claim 1, 2 or 6 comprising an electrically conductive and magnetically permeable inner shield which extends about said cylindrical space and an electrically conductive and magnetically permeable outer shield spaced from and at least partially extending about said inner shield, at least a portion of said conductor segments being disposed between said inner and outer shields.

10. A coil system as claimed in claim 9 wherein an area of said inner shield adjacent said conductor segments has slits which extend in the circumferential direction with respect to said cylindrical space.

11. A coil system as claimed in claim 10 wherein said slits have a width which decreases in the direction of said central axis from the center of said cylindrical space towards the ends thereof.

12. A coil system as claimed in claim 10 wherein said inner shield is closed in the region of said symmetry plane.

13. A coil system as claimed in claim 9 wherein said inner shield is arranged so as to extend between an object to be examined disposed in said cylindrical space and said connecting leads.

14. A coil system as claimed in claim 9 wherein said inner shield and said outer shield are interconnected at the ends of said coil system by conductor strips which extend radially with respect to said cylindrical space.

15. A coil system as claimed in claim 9 wherein at least one of said inner and outer shields is constructed of layered sheets.

16. A coil system as claimed in claim 15 wherein said at least one of said inner and outer shields has a thickness of a few skin effect penetration depths at the frequency of the RF current.

17. A coil system as claimed in claim 9 wherein at least one of said inner or outer shields is arranged on a non-conductive support.

18. A coil system as claimed in claim 17 wherein said at least one of said inner and outer shields has a thickness of a few skin effect penetration depths at the frequency of the RF current.

19. A coil system as claimed in claim 9 wherein at least one of said inner and outer shields is made of a conductive mesh.

20. A coil system as claimed in claim 1 or 3 wherein at least one of said conductor segments and said conductor elements are thin walled, conductive tubes.

21. A coil system as claimed in claim 9 wherein said outer and inner shields are cylindrical and coaxial with said central axis.

22. A coil system as claimed in claim 9 wherein said inner shield is configured so as to enclose a volume having a substantially elliptical cross sectional area in the plane perpendicular to said central axis.

23. A coil system as claim in claim 9 wherein said outer and inner shields have substantially the same radius of curvature.

24. A coil system as claimed in claim 7 wherein said shield is comprised of two section, each section being comprised of an inner portion and an outer portion which is spaced from said inner portion outwardly with respect to said central axis, said inner and outer portions of each section being joined so as to enclose a space therebetween and means for securing said sections to each other so as to permit the distance between said sections to be adjusted in a direction perpendicular to said central axis.

25. A coil system as claimed in claim 24 wherein said sections are pivotable with respect to each other about an axis lying in said symmetry plane.

26. A coil system as claimed in claim 24 wherein said connecting leads are flexible.

27. A coil system as claimed in claim 1 or 2 wherein said conductor segments have a barrel-like curvature with respect to said central axis so that the centers of said conductor segments are further away from and the ends of said conductor segments are closer to said central axis.

28. A coil system as claimed in claim 1 or 2 comprising a plurality of additional leads, one end of each of said additional leads being connected to a respective terminal arranged between each conductor element and the connecting lead associated therewith.

29. A coil system as claimed in claim 28 wherein said additional leads are coaxial lines which float at their other end.

30. A coil system as claimed in claim 9 comprising an electrically conductive coupling loop arranged between said inner shield and said outer shield at the region of at least one conductor group and symmetrically with respect to said conductor segments thereof, said loop extending substantially parallel to said central axis and having one end connected to said outer shield and the other end of said loop being coupled to a source of R.F. electromagnetic energy.

31. A coil system as claimed in claim 30 wherein said coupling loop is deformable so that the surface area enclosed by said coupling loop and said outer shield is variable.

32. A coil system as claimed in claim 30 comprising an auxiliary conductor arranged parallel to said central axis at the circumference of said cylindrical space, said auxiliary conductor being connected to said conductor elements of one of said conductor groups.

33. A coil system as claimed in claim 32 wherein said auxiliary conductor is connected between said conductor elements of each conductor group.

34. A coil system as claimed in claim 30 wherein said source of R.F. energy is coupled to said other end of said coupling loop through a variable capacitor.

35. A coil system according to claims 1 or 2 wherein at least one of said connecting leads has a tap through which R.F. energy is applied to a loop formed by said connecting leads and associated conductor elements and segments.

36. A coil system as claimed in claim 35 including a variable capacitor coupled to said tap, the R.F. electromagnetic energy being applied to said loop through said capacitor.

37. A coil system as claimed in claim 30 wherein the other end of said coupling loop is connected to said outer shield through a variable capacitor.

38. A coil system as claimed in claim 7 wherein each of said connecting leads has a tap, each of said taps being connected to said shield through a variable capacitor.

39. A coil system as claimed in claim 7 wherein each of said connecting leads has a tap and including a coaxial tuning lead connected to each tap, each of said tuning leads having a sheath which is connected to said shield and a variable length.

40. A coil system as claimed in claim 39 wherein said tuning leads float at their other end, and including a dielectric arranged inside said sheath of each lead so as to be slidable in the longitudinal direction of the respective tuning lead.

* * * * *